United States Patent
Beckius et al.

(10) Patent No.: US 6,694,739 B2
(45) Date of Patent: Feb. 24, 2004

(54) MODULAR WATER HEATER

(75) Inventors: Robert Beckius, Richland, WA (US); Michael R. Powell, Kennewick, WA (US); Seung-Ho Hong, Richland, WA (US); Charles J. Call, Albuquerque, NM (US); Ezra Merrill, Albuquerque, NM (US)

(73) Assignee: MesoSystems Technology, Inc., Kennewick, WA (US)

( * ) Notice: Subject to any disclaimer, the term of this patent is extended or adjusted under 35 U.S.C. 154(b) by 129 days.

(21) Appl. No.: 09/976,256

(22) Filed: Oct. 12, 2001

(65) Prior Publication Data

US 2003/0070430 A1 Apr. 17, 2003

(51) Int. Cl.[7] .............................................. F01K 13/00
(52) U.S. Cl. .......................................... 60/645; 60/670
(58) Field of Search ................................... 60/645, 670

(56) References Cited

U.S. PATENT DOCUMENTS

| | | | |
|---|---|---|---|
| 3,635,799 A | 1/1972 | Lowi, Jr. ...................... | 202/83 |
| 4,069,806 A | 1/1978 | Landry ........................ | 126/9 R |
| 5,048,753 A | * 9/1991 | Kellie ......................... | 237/12.3 C |
| 5,244,579 A | 9/1993 | Horner et al. ................ | 210/652 |
| 5,268,093 A | 12/1993 | Hembree et al. ........... | 210/136 |
| 5,273,649 A | 12/1993 | Magnusson et al. ........ | 210/232 |
| 5,303,691 A | 4/1994 | Armistead ................... | 126/9 R |
| 5,524,820 A | * 6/1996 | Regan ......................... | 237/19 |
| 5,762,129 A | * 6/1998 | Elliott ........................ | 165/48.1 |
| 5,956,965 A | 9/1999 | Watanabe et al. ............. | 62/389 |
| 5,975,071 A | * 11/1999 | Babington .................... | 126/33 |
| 6,003,318 A | 12/1999 | Busick et al. ................ | 62/3.64 |
| 6,053,163 A | 4/2000 | Bass .......................... | 126/312 |
| 6,126,081 A | * 10/2000 | Calvin et al. .......... | 237/12.3 B |
| 6,418,728 B1 | * 7/2002 | Monroe ........................ | 62/3.2 |

* cited by examiner

Primary Examiner—Hoang Nguyen
(74) Attorney, Agent, or Firm—Ronald M. Anderson

(57) ABSTRACT

A portable modular water heater system having a heat exchanger and a fluid heating channel for heating water from a reservoir and for optionally producing purified potable water. Optionally, a thermoelectric module is included in the system for producing an electric current usable to rechargeable batteries, drive pumps, or other devices. When the heat exchanger module is exposed to a heat source, heat absorbed by the heat exchanger is transferred to the fluid heating channel, heating the water. The heated water is forced into an upper portion of the reservoir. A condenser module is optionally coupled to the reservoir to condense steam in the upper portion. The thermoelectric module produces an electrical current when exposed to a temperature differential between the reservoir's cool water and the heat exchanger. A portable microclimate heating system, such as a jacket with tubing, can be heated with the heater system.

71 Claims, 7 Drawing Sheets

MODULAR WATER HEATER

GOVERNMENT RIGHTS

This invention was made under contract with the United States Defense Advanced Research Projects Agency (DARPA), under Contract No. DABT63-98-C-0054. The United States Government may have certain rights in the invention.

FIELD OF THE INVENTION

The present invention generally concerns portable fluid heaters, and more specifically, an efficient, portable fluid heater that can also be used in the field to heat and sterilize water, to generate electrical power, and to heat a microclimate.

BACKGROUND OF THE INVENTION

Outdoor enthusiasts, particularly those who enjoy backpacking and the like, frequently include items such as portable cook stoves, water bottles, and cooking utensils in the equipment that they carry in their pack. With the ever increasing availability of portable consumer electronics, it is becoming more and more common for such outdoor enthusiasts to also carry various consumer electronic devices when hiking. Global positioning satellite (GPS) receivers and cellular phones are two examples of electronic devices that outdoor enthusiasts often include in their gear. Particularly for backpacking enthusiasts, the size and weight of any equipment carried is of primary importance. Furthermore, equipment that is multifunctional is highly desirable, because such equipment can reduce the number of different pieces of gear.

Lightweight, portable cook stoves are well known in the art and are often required for overnight trips in wilderness areas where natural fuel is limited or where concerns about forest fires preclude building a campfire for outdoor cooking. Such stoves are available for use with a variety of different fuels, including white gas, butane/propane, kerosene, and other less common combustibles, such as hexamine fuel tablets. Generally such stoves are designed to support a cooking utensil, such as an appropriately sized metal pan or cup. While such devices are quite functional, they tend to be somewhat inefficient, as the flame first heats a portion of the cook stove, which in turn transfers heat to the cooking utensil holding the food or liquid to be heated. Often a significant portion of the cooking utensil is exposed to the ambient environment, so that a substantial portion of the thermal energy produced by the flame is transferred to the ambient environment, instead of to the food or liquid being heated.

It would therefore be desirable to provide a more efficient device to replace prior art cook stoves. Ideally, such a device should not require that a separate cooking utensil be employed for heating food or water. Furthermore, such a device should be more thermally efficient than prior art cook stoves, by minimizing the portion of thermal energy transferred to the ambient environment rather than to the food or liquid being heated. Preferably, such a device should be able to heat liquid within a conventional plastic water bottle of the type already commonly carried by outdoor enthusiasts, eliminating the need for carrying cooking utensils such as pots and/or pans.

Another item that is often carried when hiking is a portable water filter or other device for purifying or sterilizing water. Concerns about giardia and other potentially harmful bacteria that are frequently found in water sources have prompted people to either carry water from home, or to use such filters that eliminate bacteria larger than a given filter porosity from the water drawn out of streams or lakes. Those who are outdoors for extended periods of time will generally prefer to carry portable means for purifying water, in order to reduce the amount of potable water that must be carried. Also, devices that simply purify water by filtering out harmful bacteria will not have an effect on viral agents, as viruses are significantly smaller than bacteria. Several portable water treatment devices, including those disclosed in U.S. Pat. Nos. 5,273,649; 5,268,093; 5,244,579; and 3,635,799 have been developed for treating water from local sources, such as streams or lakes, so that it can be safely ingested. However useful these devices are, they require the outdoor enthusiast to include yet another item of equipment in the gear that is carried. While it is possible to simply boil water in a conventional pot over a conventional stove, it is desirable to eliminate gear that can be viewed as redundant. Thus, it would be desirable to provide a device that can be used for both heating water for cooking purposes and for sterilizing water, without requiring any pot.

A further item that is often used for outdoor activities is a warming device. For example, many outdoor enthusiasts and outdoor sports fans carry one or more hand warmers in addition to multiple layers of clothing. Some of theses hand warmers burn a carbon stick inside an insulated container that fits in a jacket pocket or at the foot of a sleeping bag. The amount of heat produced can not be easily regulated, and the carbon stick typically does not last more than an hour or two. As a result, the user may have to carry many carbon sticks if the user will be outdoors for a long time. Moreover, the heat produced is concentrated in a single area, such as a pocket, and does not readily provide heat to other portions of the outdoor enthusiast's body. Other warming packs produce heat as a result of a chemical reaction, such as those packs used by skiers in jackets, gloves, and boots. However, again, the amount of heat produced can not be easily regulated, the heat-producing reaction typically does not last more than a few hours, and the heat is not uniformly distributed very far the warming pack. Thus, again the outdoor enthusiast must to carry multiple packs for extended periods outdoors or to warm various parts of the body. It would be desirable to utilize a single heating device, or at least the same type of fuel, for warming the outdoor enthusiast as well enabling the outdoor enthusiast to cook and boil drinking water.

Finally, as noted above, outdoor enthusiasts are likely to include portable consumer electronics such as GPS receivers and cell phones within the assortment of gear that they carry. To increase the operating time of such devices on trips that may extend over several days, additional batteries must be carried. However, spare batteries are relatively heavy and increase the number of pieces of equipment that must be carried. It would therefore be desirable to provide a device that can not only heat water for cooking, purify water as required, and keep the outdoor enthusiast warm, but can also recharge the batteries used in portable electronic devices.

The prior art does not teach or suggest a replacement for a portable device that can provide the multifunctional capabilities discussed above. It will therefore be apparent that such a device would have considerable utility for both outdoor sports and military-related activities.

SUMMARY OF THE INVENTION

In accord with the present invention, a portable water heating apparatus adapted to couple with a portable reservoir employed for carrying and storing water, and adapted to be used with a source of heat is defined. The apparatus includes a fluid heating channel adapted to be coupled in fluid communication with the portable water reservoir disposed above the heat exchanger, and a heat exchanger adapted to absorb thermal energy from a source of heat. The heat exchanger is disposed adjacent to and in thermal contact with the fluid heating channel so that heat is readily transferred from the heat exchanger to the fluid heating channel. Water disposed within the fluid heating channel is thus heated. The heated water and/or steam is introduced into the portable water reservoir. Heating of the water contained within the portable water reservoir continues until a desired temperature is achieved.

Preferably, the portable water reservoir has an opening at one end that is sealingly engaged by a cap included on the water heating apparatus, and the water reservoir is then inverted so that the opening sealed by the cap faces downward. The cap has a fluid inlet through which the heated water flows into the portable water reservoir from the fluid heating channel and a fluid outlet through which the cool water in a lower portion of the water reservoir flows into the fluid heating channel.

Preferably, a seal between the cap and the opening of the portable water reservoir fails at a predetermined pressure, thereby releasing excess pressure. In at least one embodiment, the predetermined pressure is at least approximately 10 psi. Also preferably, the fluid outlet includes a one-way valve, which permits water to flow out of the fluid outlet, but not in. Consequently, water disposed within the fluid heating channel can only exit through the fluid outlet. The one-way valve changes between an open state and a closed state in response to pressure conditions within the portable water reservoir and the fluid heating channel.

To reduce the weight of the device, the heat exchanger is preferably fabricated from a low density and thermally conductive metal. In at least one embodiment, the heat exchanger is preferably removably attached to the cap.

In one preferred embodiment, the apparatus includes a hot water outlet in fluid communication with the water reservoir so that hot water can selectively be removed from the portable water reservoir. A pressure relief valve designed to open at a predetermined pressure is optionally included. The predetermined pressure corresponds to a desired temperature, enabling water of the desired temperature to be automatically discharged through the hot water outlet.

A fluid channel coupled to the cap and having a first end and a second end is preferably included. The first end is coupled in fluid communication with the hot water outlet, and the second end is coupled in fluid communication with the upper portion of the portable water reservoir. Steam accumulating in the upper portion of the water reservoir can be removed from the water reservoir through the hot water outlet. In this embodiment, the heating apparatus includes a condenser adapted to be coupled to the portable water reservoir, which is usable to condense steam contained therein into liquid water, thereby providing purified potable water.

Preferably, the portable water reservoir is substantially transparent or translucent to visible light, so that a user can visually determine when water contained within the water reservoir boils. In at least one embodiment, the apparatus includes a temperature-sensing element usable for displaying a temperature of the water disposed within the water reservoir. A liquid crystal thermometer can be employed as the temperature-sensing element.

To generate electrical energy while heating water, some embodiments include a thermoelectric module that generates an electric current when exposed to a temperature differential. The thermoelectric module is disposed between the heat exchanger and the water reservoir, enabling a first surface of the thermoelectric module to be exposed to relatively cool water from the water reservoir, while a second and opposite surface is adjacent the heat exchanger. Preferably, the thermoelectric module includes electrical leads capable of being connected to supply an electrical current to an electrical device or a rechargeable battery.

The water heater can be used to heat water for cooking or for beverages and the like in a plastic portable water reservoir, to generate steam that can be condensed to provide purified potable water, and to generate electricity using the thermoelectric module. By suitably configuring the water heater apparatus, any combination of the above can be simultaneously executed.

Other aspects of the present invention are directed to methods for the water heater for the purposes noted above. These methods include steps that are generally consistent with the functions of the elements included in the apparatus described above.

Yet another aspect of the invention is directed to a portable apparatus for heating a microclimate. The portable apparatus comprises a portable microclimate heating article (PMCHA) that defines the boundaries of the microclimate, and a portable heating unit in fluid connection with the PMCHA. The PMCHA comprises an element that defines the structural configuration of the PMCHA, such as a wearable jacket, a sleeping bag, a tent, or other portable item. The PMCHA also comprises a delivery channel incorporated into the element to carry a heating fluid that transfers heat energy through the element to the microclimate. The portable heating unit is preferably small enough to carry on a belt and comprises a heat source; a heat exchanger disposed in proximity to the heat source; and a heating chamber coupled to the delivery channel and in proximity to the heat exchanger. The heat source provides heat energy to the heat exchanger, and the heat exchanger transfers heat energy to the heating fluid that flow through the heating chamber out to the delivery channel of the PMCHA. The heating fluid circulates between the heating chamber and the PMCHA.

A thermoelectric unit is also optionally located between the heat exchanger and the heating chamber. In this case, the heating fluid in the heating chamber is used as the cold heat sink and the heat exchanger is used as the hot heat source. The thermal transfer between the heat exchanger and the heating fluid in the heating chamber may not produce as much electrical energy as a the other embodiments that use a cold reservoir, but the temperature differential is still sufficient to produce electrical energy. The electrical energy may be provided to a pump in the portable heating unit that pumps the heating fluid through the PMCHA. The electrical energy may also be provided to a rechargeable battery, or other electrical device.

A further aspect of the invention is a method for heating a microclimate comprising the steps of incorporating a delivery channel into the PMCHA; thermally coupling the delivery channel to the portable microclimate heating unit; inserting a heating fluid into the delivery channel; heating the heating fluid with the portable microclimate heating unit; and causing the heating fluid to flow through the delivery channel of the PMCHA, thereby causing thermal energy to transfer from the heating fluid to the PMCHA defining the microclimate.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
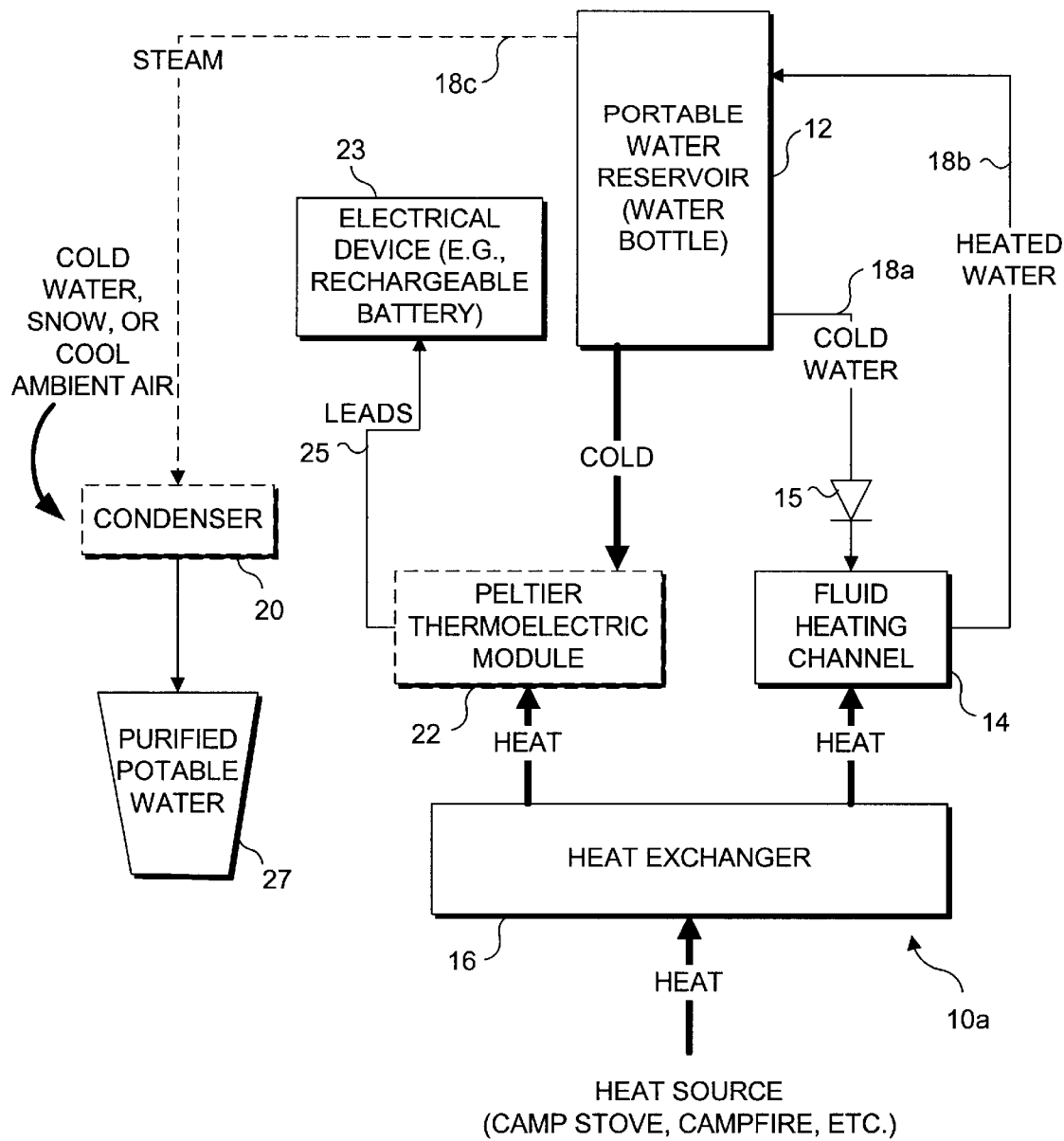
FIG. 1 is a block diagram illustrating components used in a modular water heater system in accord with the present invention.

An exemplary modular water heater 10a shown in FIG. 1 includes a portable water reservoir 12, a fluid heating channel 14, and a heat exchanger 16. Relatively cool water from a lower portion of portable water reservoir 12 flows through a cold water line 18a into fluid heating channel 14. When heat exchanger 16 is disposed adjacent to a source of heat, the heat absorbed by the heat exchanger is transferred to fluid heating channel 14, which is disposed adjacent to the heat exchanger and in thermal contact with it. The heat source will preferably be a camp stove or a campfire, but can alternatively comprise any other available suitable source of heat, such as a candle or a fuel tablet. The heat transferred to fluid heating channel 14 from heat exchanger 16 heats the water in the fluid heating channel, eventually transforming at least a portion of the water into steam as the water in the portable water reservoir is heated by the modular water heater. The hot water and/or steam travels from fluid heating channel 14 through a hot water line 18b and returns to an upper portion of portable water reservoir 12. Note that the heavy or bold arrows indicate an exchange of thermal energy rather than a movement of fluid.

While not intending to limit the present invention, the portable water reservoir used in a preferred embodiment of the present invention comprises a conventional water bottle made of LEXAN™ or other transparent or translucent plastic and is of the type typically used for storing and/or carrying water when backpacking or involved in other activities in the outdoors, where potable water is not readily available from a municipal or domestic water supply system.

In modular water heater 10a, cold water from the portable water reservoir flows through a one-way (i.e., a check) valve 15 into a fluid heating channel. As the fluid heating channel is heated by heat transferred from the heat exchanger, the water in the channel is heated and eventually boils. The pressure of the steam formed during the boiling process drives a column of fluid upward through hot water line 18b into the top portion of portable water reservoir 12. One-way valve 15 prevents the hot water from traveling back into the lower portion of the portable water reservoir, so that the boiling water and steam are instead driven from the fluid heating channel in the opposite direction and into the top of the portable water reservoir. Hot water line 18b is directed into an upper portion of portable water reservoir 12, so that water flowing into the fluid heating channel through the one-way valve from the lower portion of the portable water reservoir is relatively cool, while water that has already been heated in fluid heating channel 14 is returned to the upper portion. The natural convection current resulting from warm fluid rising through hot water line 18b to be replaced by cooler water flowing into the fluid heating channel through the one-way valve also supports this direction of water flow through the modular water heater.

Figure 2:
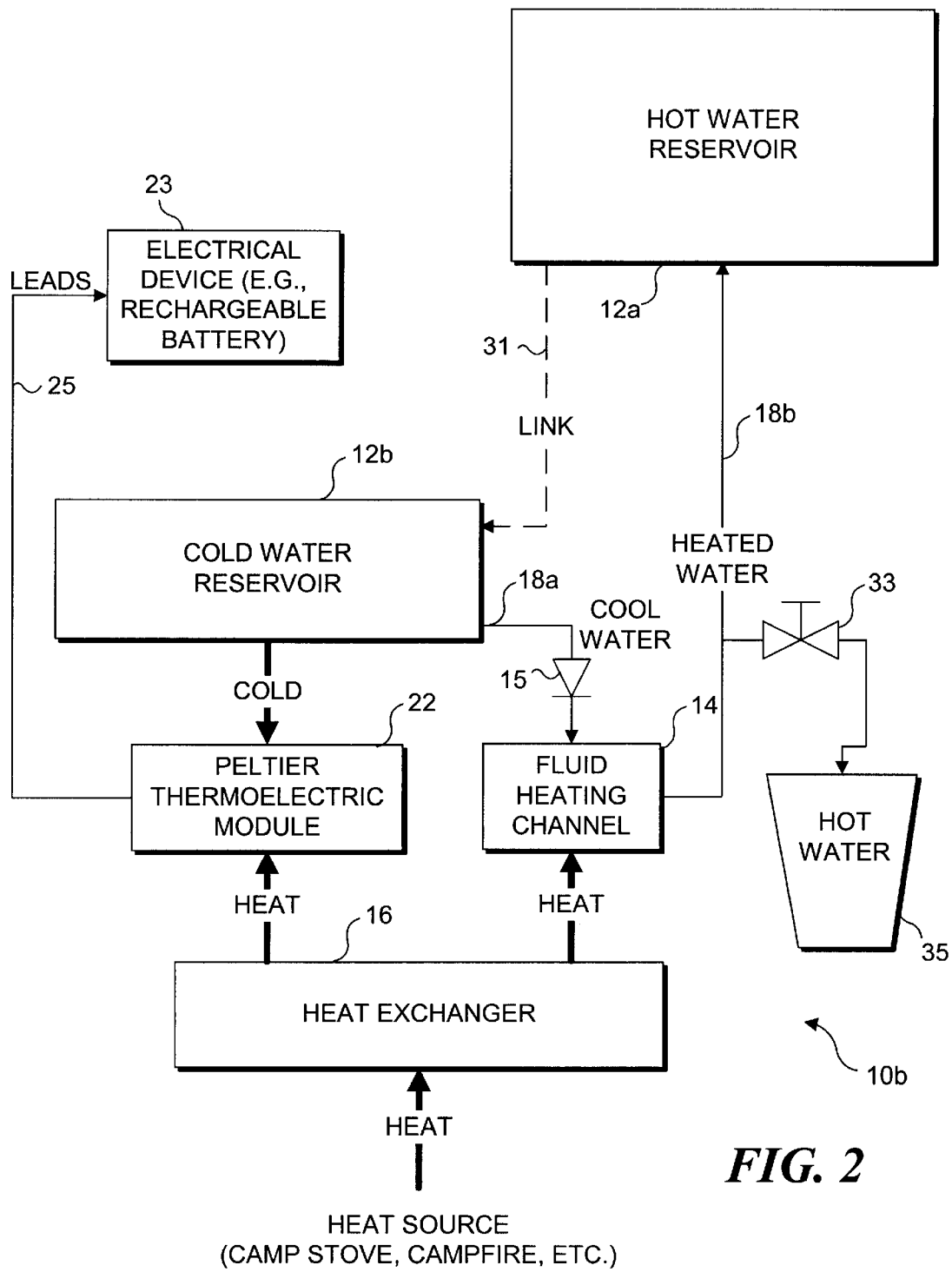
FIG. 2 is a block diagram illustrating the components used in an alternative configuration of the modular water heater system, for generating electricity while heating water.

The flow of water into fluid heating channel 14 from the portable water reservoir and the heating of the water in the fluid heating channel are continued until the water contained in portable water reservoir 12 has attained a desired temperature. It should be understood that if desired, hot water line 18b can be directed into a separate hot water reservoir 12a, rather than into water reservoir 12, and the cool water can be drawn from a separate cool water reservoir 12b, as shown in FIG. 2. Also, the lower portion of the separate hot water reservoir can optionally be connected to the upper portion of the separate cool water reservoir by a line 31, as shown in FIG. 2.

By using a portable water reservoir that is employed to carry and/or store water to also heat water in the present invention, an outdoor enthusiast can avoid carrying a pot for heating water. Furthermore, the modular water heater can perform additional functions if additional modular components are included. For example, as shown in FIG. 1, an optional condenser 20 that is coupled to portable water reservoir 12 through an optional steam line 18c enables modular water heater 10a to produce purified potable drinking water 27 by condensing steam collected in the upper portion of the portable water reservoir. In this embodiment, the steam generated in fluid heating channel 14, which was conveyed into water reservoir 12 through hot water line 18b, is removed via steam line 18c and conveyed into condenser 20. Preferably, condenser 20 comprises a metal coiled tube that is exposed to a cold sink, such as cool ambient air, or more preferably, cool water or snow (if available). The steam flowing through the metal coil tube is converted into liquid water. In an outdoor environment, the cool water used for the cold sink can be obtained from a stream or lake, or can be snow obtained from a snow bank. The water that is condensed will normally be potable, depending upon the contaminants that were included in the water processed in the portable water reservoir. Clearly, harmful contaminants that have a boiling point about equal to or below that of water will also be included in the water that is condensed by condenser 20, but such contaminants are typically not found in outdoor water sources. Thus, an outdoor enthusiast or military personnel can process local (and possibly contaminated) water with the modular water heater once a supply of potable water carried into the field has been exhausted.

Those of ordinary skill in the art will recognize that converting water contained in the portable water reservoir into steam that is condensed into liquid water and collected in a separate container leaves behind, and thus removes, a majority of inorganic contaminants, and also deactivates biological toxins such as *E. coli* that may be present in the water. Inorganic contaminants, such as salt and dirt, remaining in the portion of the water within the portable water reservoir that isn't converted to steam can be easily removed from the water reservoir simply by dumping the water. Various biological contaminants, such as bacteria and viruses, are deactivated upon exposure to high temperatures. As a result, the steam comprises a purified form of water (in vapor phase), and purified liquid water can be obtained by cooling and condensing the steam as described above. Preferably, the condenser is designed so that it can be easily and readily removed and cleaned, since a precipitate may form on internal surfaces of the condenser over time.

Modular water heater 10a can also be used to generate a modest amount of electricity, as shown in FIG. 1, if thermoelectric module 22 is employed. Thermoelectric module 22 is a conventional Peltier device that generates an electrical current when opposite sides of the device are exposed to a substantial temperature differential. While such thermoelectric modules are generally used as cooling (and/or heating) devices when energized with an electrical current, they can also be employed to generate modest amounts of electrical power when exposed to a substantial temperature differential. Thermoelectrical module 22 is not particularly efficient in producing an electrical current; however, the temperature differential between relatively cool water in portable water reservoir 12 and relatively hot heat exchanger 16 can be employed to generate an electrical current that is sufficient to energize a low-power electrical device or to charge a rechargeable battery.

As indicated in FIG. 1, portable water reservoir 12 is disposed adjacent to thermoelectric module 22, such that the portable water reservoir 12 cools a first side of thermoelectric module 22 (note the bold arrow labeled "COLD"). Similarly, heat exchanger 16 is disposed adjacent to thermoelectric module 22, such that the opposite side of the thermoelectric module receives heat from heat exchanger 16 (note the bold arrow labeled "HEAT"), thereby providing a temperature differential between opposing faces of the thermoelectric module that generates electrical current conveyed through leads 25 to energize an electrical device 23, such as a rechargeable battery.

Thermoelectric modules employ appropriately doped semiconductor materials in place of the dissimilar metals used by Peltier. The thermoelectric semiconductor material most often used is an alloy of Bismuth Telluride ($Bi_2Te_3$) that has been suitably doped to provide individual blocks or elements having distinct "N" and "P" characteristics. Other potentially useful thermoelectric materials include Lead Telluride (PbTe), Silicon Germanium (SiGe), and Bismuth-Antimony (Bi—Sb) alloys. Bismuth Telluride-based thermoelectric modules are designed primarily for cooling or combined cooling and heating applications where electrical power creates a temperature difference across the module; however, when a temperature differential is applied to opposite faces of the module, it generates electrical power. Because thermoelectric modules are solid-state components, they have no moving parts to wear out, and are considered to be highly reliable components. In some applications, thermoelectric modules have been used continuously for twenty or more years, and the life of a thermoelectric module can often exceed the life of associated equipment. Thermoelectric modules fabricated as small, lightweight devices suitable for use with the present invention can be obtained from the HI-Z Technology, Inc. of San Diego, Calif.

Because the modular water heater is exposed to relatively large temperature changes and concomitant thermal cycling, the thermoelectric module is preferably not connected to the assembly at its cold side with solder or epoxy. Unless the thermal coefficients of expansion of all system components are similar, rigid bonding of the components, combined with temperature cycling, can cause early failure of the thermoelectric module due to induced thermal stresses. Instead of fixedly connecting the cool side of the thermoelectric module to the assembly, the module is preferably held by clamping (compression) using a flexible mounting material such as a non-silicone thermal grease, graphite foils, or indium foils. Hot side rigid bonding is generally less of a problem, because the hot side temperature tends to be relatively constant during operation, but should still be avoided. Since this invention subjects thermoelectric modules to thermal cycling over a wide temperature range, the failure rates of the thermoelectric module are higher than normal. However, because the normal useful life of thermoelectric modules is so long (up to 200,000 hours), it is not anticipated that thermoelectric module failure rates will be a concern in this application.

It should be understood that a modular water heater in accord with the present invention can be configured in a variety of different embodiments for use in heating water, generating steam that is condensed into purified potable water, and/or generating electricity. Different embodiments are possible, based on the desired use of the invention. For example, if a modular water heater is to be used primarily to generate electricity and hot water, a user will preferably employ a modular water heater 10b, as shown in FIG. 2, which is particularly well-adapted to simultaneously produce hot water and generate electricity.

Cold water reservoir 12b for modular water heater 10b will typically be substantially larger than portable water reservoir 12 in modular water heater 10a, in order to provide more cold water for use in maintaining a temperature differential across thermoelectric module 22, and to enable the system to operate sufficiently long enough to produce electricity required to energize electrical device 23. A significant difference between modular water heater 10b and modular water heater 10a is that the heated water (and steam) exiting fluid heating channel 14 are directed by hot water line 18b to separate hot water reservoir 12a.

In modular water heater 10a of FIG. 1, the hot water and steam are returned to portable water reservoir 12, since a primary goal of that embodiment is to heat the water in water reservoir 12 to a desired temperature so that it can be used for cooking and other purposes, and the generation of electrical energy is of less importance. However, as the water temperature in water reservoir 12 increases, the temperature differential between the cool water reservoir side of the thermoelectric module and the hot heat exchanger side of the thermoelectric module decreases. At some point, the temperature differential will be insufficient to enable a thermoelectric module to generate a useful amount of electrical power. On the other hand, modular water heater 10b (see FIG. 2), is specifically adapted to maintain the temperature differential between the cold water side of thermoelectric module 22 and the heat exchanger side of thermoelectric module 22. By diverting the hot water into separate hot water reservoir 12a, the temperature within cold water reservoir 12b does not increase. Thus, as long as cold water remains in cold water reservoir 12b, a temperature differential can be maintained between the cold water side of the thermoelectric module and the heat exchanger side. If sufficiently large hot and cold water reservoirs are used, it may be desirable to provide an optional line 31 that couples the lower portion of hot water reservoir 12a in fluid communication with the upper portion of cold water reservoir 12b. In essence, if line 31 is added, the embodiment in FIG. 2 becomes generally equivalent in operation to that of the embodiment in FIG. 1. Also shown in FIG. 2 is a valve 33 that is used to selectively divert hot water into a container 35. This hot water can be used, for example, to make hot instant beverages or for rehydrating freeze-dried meals. Instead, the hot water collected in hot water reservoir 12a can be used for these and other purposes.

With the exception of diverting the hot water into hot water reservoir 12a, modular water heater 10b functions similarly to modular water heater 10a. One-way valve 15 enables cool water to flow from the cool water reservoir into fluid heating channel 14. The one-way valve prevents heated water from the fluid heating channel from entering the cool water reservoir, and the hot water and any steam produced exit the fluid heating channel into hot water reservoir 12a via hot water line 18b. The process continues until cold water reservoir 12b is empty, the heat source becomes inoperative, or heat exchanger 16 is removed from the heat source.

Figure 3:
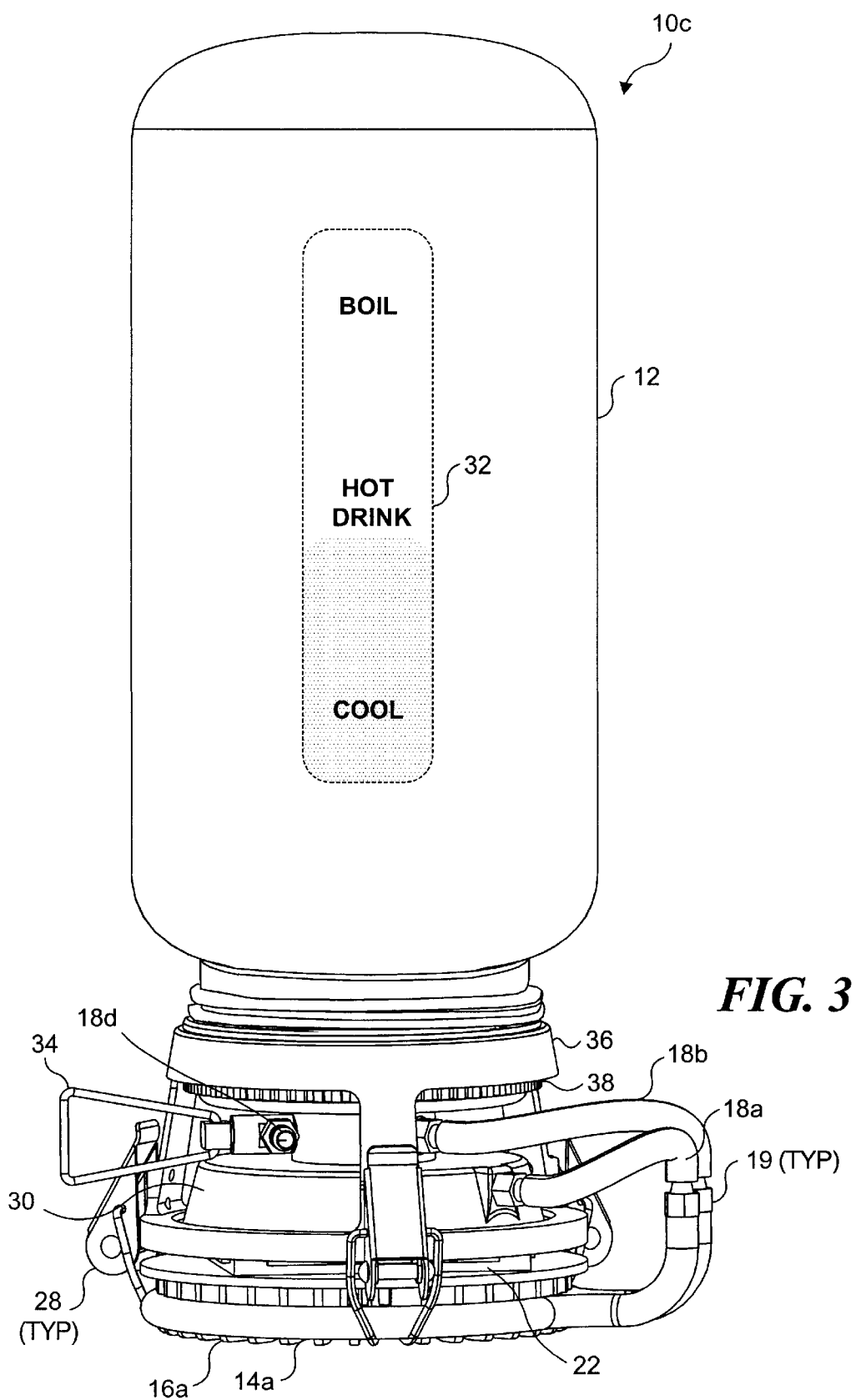
FIG. 3 is a side elevational view of a preferred embodiment of the modular water heater system.

A preferred embodiment of a modular water heater 10c is shown in FIG. 3. A standard water bottle cap 38 is modified to include both a hot water inlet and a cold water outlet (neither shown in this Figure). The path of hot water moving through the cap can be clearly seen in FIG. 4. A frame 36 is attached to cap 38, and a heat exchanger 16a is removably attached to frame 36 by a plurality of quick-release clips 28. Relatively cool water from within portable water reservoir 12 passes through the fluid outlet in cap 38 and flows into a cold water cavity 30. The one-way valve controlling the flow of water from water reservoir 12 into cold water cavity 30 can be clearly seen in FIGS. 4 and 5. Cold water cavity 30 is in fluid communication with cold water line 18a and fluid heating channel 14a, and cold water flowing into cold water cavity 30 also fills cold water line 18a, fluid heating channel 14a, and possibly a portion of hot water line 18b. Preferably the connection between fluid heating channel 14a and hot water line 18b is disposed at an elevation substantially equal to or slightly higher than the water level in cold water cavity 30, such that little cold water flows from fluid heating channel 14a into hot water line 18b. Note the purpose of cold water cavity 30 is to ensure that an upper surface of thermoelectric module 22 is kept relatively cool by heat transfer with the cool water contained in the cold water cavity. Preferably, cold water cavity 30, which is disposed adjacent to thermoelectric module 22 (if the thermoelectric module is used), is of about the same size and shape as the upper surface of the thermoelectric module.

Preferably, fluid heating channel 14a is fabricated from brass or some other material having a relatively high thermal conductivity, and is fixedly attached to heat exchanger 16a. As described above, when heat exchanger 16a is placed in thermal contact with a heat source, the relatively cold water in fluid heating channel 14a is heated, producing hot water and steam. This hot water and steam rises from fluid heating channel 14a through hot water line 18b and flows into water reservoir 12 via the fluid inlet in cap 38.

The bottom side of thermoelectric module 22 is disposed adjacent to heat exchanger 16a. Thus, thermoelectric module 22 is sandwiched in between cold water cavity 30 and heat exchanger 16a, so that it is exposed to a substantial temperature differential that enables the thermoelectric module to generate electricity. It should be noted that thermoelectric modules are relatively expensive components, easily exceeding the combined costs of all of the other components of the modular water heater. Thus, it is anticipated that thermoelectric module 22 will not be included in some embodiments, and that the modular water heater will be employed only for heating and/or purifying water. By enabling heat exchanger 16a to be removably attached to frame 36, thermoelectric module 22 can readily be removed from or added to modular water heater 10c.

Note that a plurality of quick-connect fittings 19 are employed in the various fluid lines, such that the fluid heating channel and heat exchanger module can be completely separated from the portable water reservoir and cap. Cold water line 18a and hot water line 18b are attached to fittings 19. Preferably cold water line 18a and hot water line 18b are fabricated from a polymer tubing material that can withstand the expected temperatures to which they will be exposed in this apparatus. Also, it should be noted that the portable water reservoir and the cap are threadedly engaged, such that a different water reservoir having a different volumetric size can be employed as the portable water reservoir with the same cap, which has been adapted to include the required fluid inlets and fluid outlets. While other means can be used to attach a cap to a portable water reservoir, such as snap-type fittings, threaded fittings are preferred, as they are generally more secure, and they provide a leak-proof fit and seal.

An optional temperature indicator 32 had been provided on the outer surface of portable water reservoir 12 in FIG. 3 to indicate the relative temperature of the water contained within water reservoir 12. As illustrated, temperature indicator 32 is indicating that the temperature is rapidly approaching the optimum temperature for use in making hot drinks or beverages such as coffee or tea, or for mixing with dry instant foods such as soups and stews to rehydrate them. Further operation of the modular water heater 10c will drive the temperature of the water within water reservoir 12 to the boiling point. It is anticipated that a flexible liquid crystal thermometer will be employed as the temperature indicator. Such thermometers are readily available for use in beverage and brewing applications, and are available from Liquid Crystal Resources of Northbrook, Ill.

Water reservoir 12 is preferably fabricated from a substantially transparent material, so that a user will be able to determine the approximate temperature of the liquid contained within water reservoir 12, even without the use of temperature indicator 32, by observing the formations of bubbles, which indicate that the water temperature within the container is nearing the boiling point. Thus, temperature indicator 32 is not a required element, but rather an optional element that can be included to provide more precise temperature indications to a user. Note that because the boiling temperature of water is dependent on pressure conditions, and water boils at different temperatures at different altitudes. Thus when the apparatus is employed at high altitudes, the observation of boiling water is less of a quantitative measure of the water temperature, but more of a qualitative measure, of the water temperature. A hot water/steam outlet 18d is provided so that a user can remove either hot water or steam from portable water reservoir 12 without requiring cap 38 to be removed. A release lever 34 is used to selectively open a valve, i.e., valve 33 (see FIG. 2), to enable hot water and/or steam to exit through hot water/steam outlet 18d.

Figure 4:
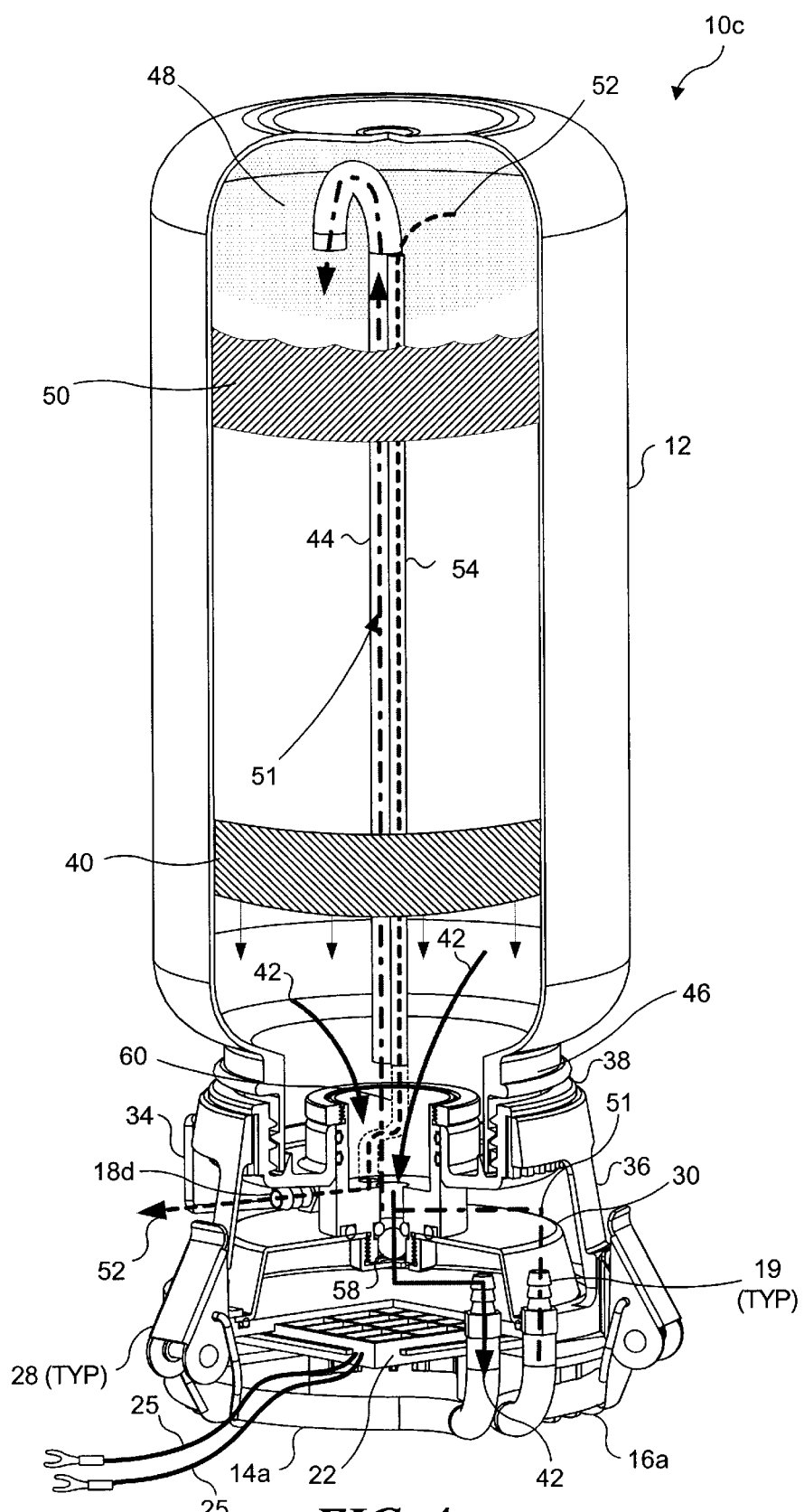
FIG. 4 is a cut-away isometric view of the modular water heater of FIG. 3.

The flow paths of relatively cool and relatively hot water and steam within modular water heater 10c are clearly illustrated in FIG. 4. Cold water exiting water reservoir 12 through its downwardly facing opening and the fluid outlet in cap 38 is indicated by cold water arrows 42; hot water and steam entering water reservoir 12 from fluid heating channel 14a are indicated by a hot water arrows 51, and steam exiting water reservoir 12 to be condensed into a substantially purified liquid water is represented by a steam arrow 52.

Prior to placing heat exchanger 16a in thermal connection with a heat source, water disposed in water reservoir 12 will be at a substantially ambient temperature. A mass of water at ambient temperature 40 is schematically illustrated in FIG. 4, disposed in a lower portion of portable water reservoir 12. In addition, a mass of relatively hot water 50 is shown in the upper portion of the portable water reservoir. It will be understood that a temperature gradient exists between ambient water mass 40 and hot water mass 50 in portable water reservoir 12. Moreover, convection will ensure that cooler water will naturally fall to the bottom of the portable water reservoir, while hotter water will naturally rise to the top of the portable water reservoir. While the temperature of the water disposed in portable water reservoir 12 is substantially constant before heat exchanger 16a is heated by a heat source, once the heating process begins, hot water is conveyed to an upper portion of water reservoir 12, while cooler water remains at the bottom of portable water reservoir 12.

Ambient temperature water mass 40 (or warmer water above ambient temperature after the heating process has been running for a time) flows from the lower portion of water reservoir 12 as indicated by arrows 42. The relatively cool water flows through a one-way ball valve 58 into cold water cavity 30.

Cold water cavity 30 is in fluid communication with fluid heating channel 14a, via cold water line 18a (as shown in FIG. 3). When heat exchanger 16a is heated by a source of heat, and after a sufficient period of time has passed to enable the relatively cool water disposed in fluid heating channel 14a to be heated, forming steam, the pressure within the fluid heating channel forces the heated water and/or steam through hot water line 18b (see FIG. 3 and through the fluid inlet in cap 38. The heated water is preferably conveyed into the top portion of portable water reservoir 12 through a fluid line 44. One-way ball valve 58 prevents the heated water from flowing back into cold water cavity 30. The only path available for the hot water and steam to exit the fluid heating channel is through hot water line 18b. While hot water and steam would naturally rise to the upper portion of water reservoir 12 if introduced into the lower portion of the portable water reservoir, fluid line 44 minimizes heating of the cooler water in the lower portion of the portable water reservoir by conveying the hot water and steam into the upper portion of the portable water reservoir. Here, the hot water and steam separate into a steam fraction 48, which naturally rises to the extreme upper portion of water reservoir 12, and hot water mass 50, which is disposed immediately below the steam.

The pressure in the portable water reservoir increases as more of the water is converted to steam. Also, over time, the average temperature of the water in the portable water reservoir increases well above the initial ambient temperature, and there is a much-reduced temperature gradient between water in the lower and upper portions of the portable water reservoir. As the temperature of the water entering the cold water reservoir increases over time, the thermoelectric module is exposed to a decreasing temperature differential, and its efficiency in producing electrical current tends to decrease.

If a user desires to employ modular water heater 10c to produce steam that can be condensed into purified potable water, before starting the heating process, a fluid line 60 is preferably inserted into cap 38 to connect to a lower portion of a steam line 54 with hot water/steam outlet 18d. Steam line 54 extends from the lower portion into the upper portion of water reservoir 12, where a mass of steam will naturally accumulate after the heating process has progressed for a time. When release lever 34 is opened, steam from the upper portion of portable water reservoir 12 passes through steam line 54, through fluid line 60, and exits via hot water/steam outlet 18d. This steam can then be conveyed through an external fluid line (not shown in FIGS. 4 or 5, but corresponding to steam line 18c in FIG. 1) to condenser 20 (also shown in FIG. 1), which when cooled by an available cold sink, causes the steam to condense, forming purified potable liquid water.

Note that if optional fluid line 60 is not included, hot water/steam outlet 18d will be in fluid communication with a lower portion of water reservoir 12. After the modular water heater 10c has been in operation for a suitable length of time, release lever 34 can be opened to enable water, which is not relatively hot, from the lower portion of the water reservoir to be removed. If release lever 34 is opened too early in the heating process, the water released from the lower portion of the portable water reservoir will likely be too cool.

In at least one embodiment, hot water/steam outlet 18d includes a pressure release valve (not separately shown), such that hot water/steam outlet 18d opens automatically when a predetermined pressure has been obtained within water reservoir 12. This predetermined pressure preferably corresponds to a desired water temperature.

Optionally, instead of conveying the hot water and/or steam into reservoir 12, external hot water reservoir 12a can be coupled to the end of fluid heating channel 14a via hot water line 18b (a longer fluid line would typically be employed for this purpose). This option corresponds to the configuration shown in FIG. 2.

Figure 5:
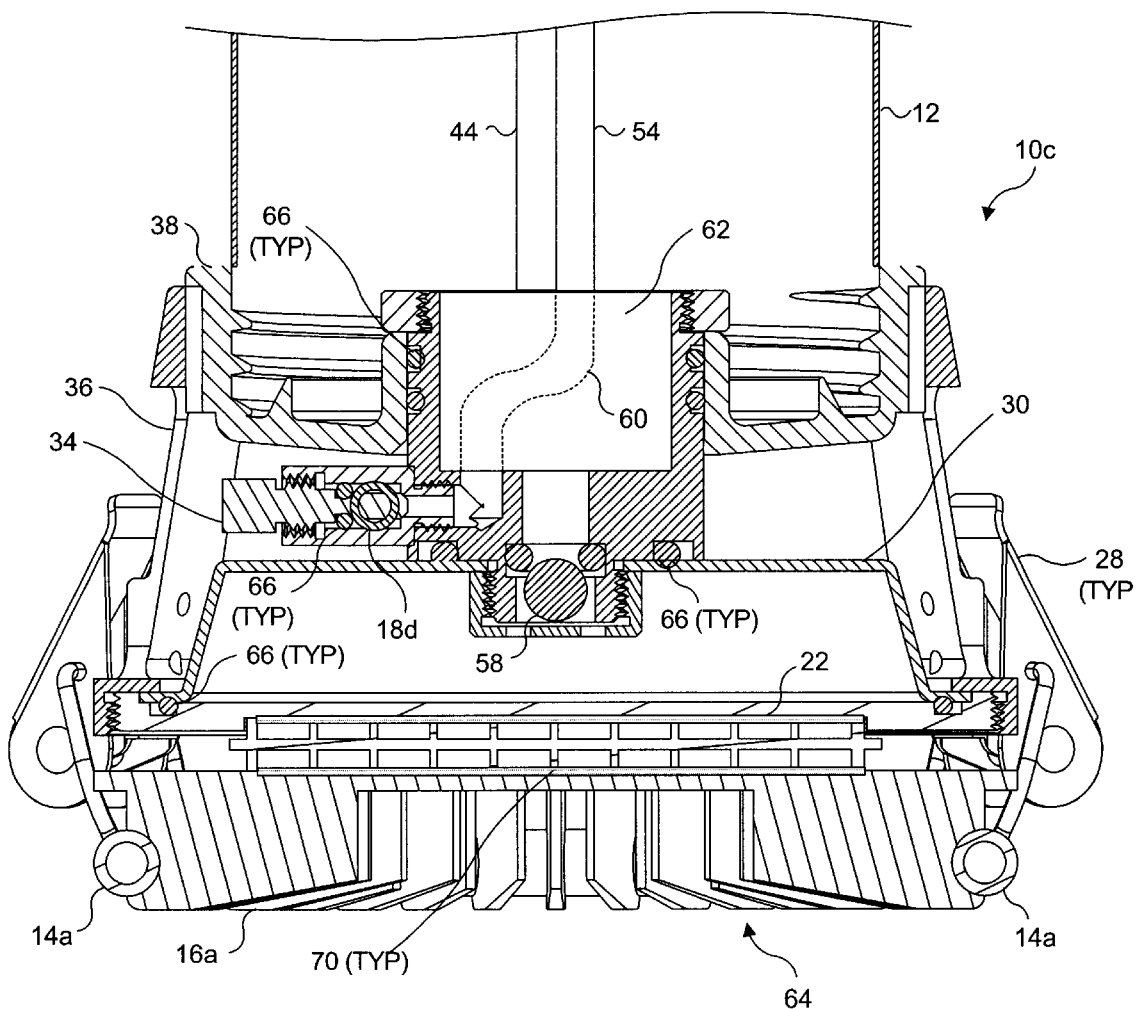
FIG. 5 is a sectional view of the modular water heater system of FIG. 3, showing only a lower portion of the water reservoir module.

Referring now to FIG. 5, portable water reservoir 12 threadably engages cap 38. Cap 38 includes a fluid passage 62 providing fluid communication between hot water/steam outlet 18d, one-way ball valve 58 (which defines the cold water outlet), and the hot water/steam inlet (not visible in this Figure), which is coupled by hot water line 18b (shown in FIG. 3) in fluid communication with fluid line 44.

Because modular water heater 10c will likely be used by hikers and other outdoorsmen, modular water heater 10c is preferably light in weight. Accordingly, heat exchanger 16a is preferably fabricated from a lightweight and thermally conductive material, such as aluminum. In the illustrated preferred embodiment, heat exchanger 16a incorporates a plurality of radially aligned fins 64 to provide efficient heat transfer from a heat source to fluid heating channel 14a and to the lower surface of thermoelectric module 22. Heat exchanger 16a is thus well-adapted to be placed in thermal communication with a heat source, such as an open flame, available from a campfire or a camp stove. Preferably, the lower surface of heat exchanger 16a is relatively flat, such that heat exchanger 16a can be used to support modular water heater 10c above the heat source or when not being used for heating water.

The plurality of quick-release clips 28 provide a compressive force that sandwiches thermoelectric module 22 between heat exchanger 16a and cold water cavity 30. Preferably, a thin layer of thermally conductive grease 70 is applied to one or both of the surfaces of thermoelectric module 22 that are disposed adjacent to cold water cavity 30 and heat exchanger 16a. A plurality of O-rings 66 are included on fluid line connections and other interfaces between components to prevent fluid leaks. Those of ordinary skill in the art will readily understand that such O-rings are commonly employed in fluid systems to ensure that a good seal is achieved between mating components. However, it is contemplated that the seal between cap 38 and the portable water reservoir can be designed to fail if the pressure within the portable water reservoir exceeds a predetermined maximum limit. The seal provided can be designed to fail at this predetermined pressure by including an elastomeric material (not shown) in the sealing surfaces between these components that will "blow out" if exposed to a pressure above the predetermined fail safe limit. This safety feature can optionally be included as a redundant failsafe mechanism, even if hot water/steam outlet 18*d* includes a pressure release valve, as described above.

Figure 6:
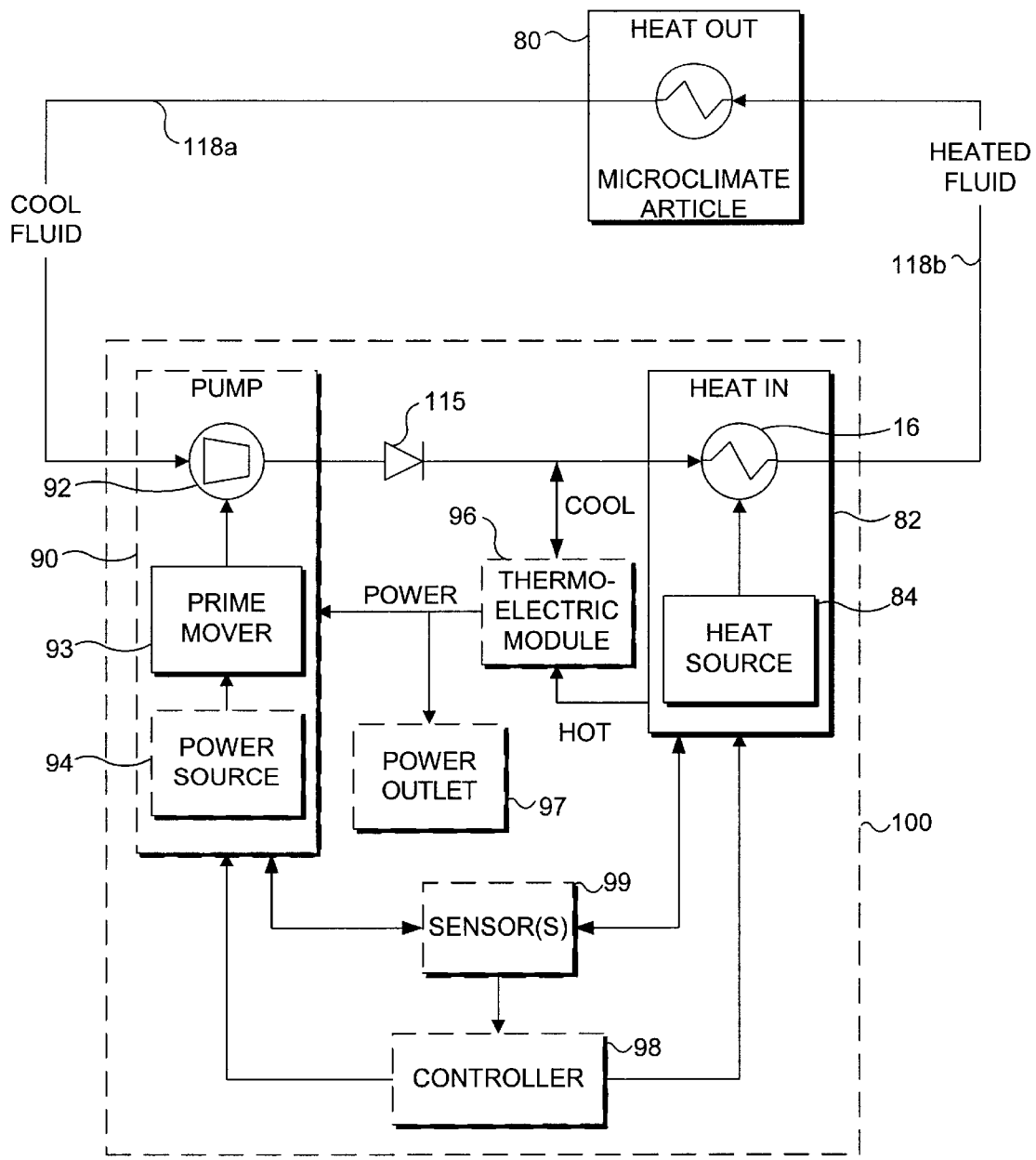
FIG. 6 is a block diagram illustrating a preferred embodiment of a system for heating a microclimate.

FIG. 6 is a block diagram illustrating a preferred embodiment of a system for heating a microclimate. A microclimate is an area that can be heated by a microclimate article 80, which may comprise a wearable jacket, a vest, a body garment, a sleeping bag, a sleeping mat, a blanket, a tent, a container, or other portable item that can be used to heat an area. Microclimate article 80 includes delivery tubing 118*b* that carries a heating fluid through the microclimate article. Heat is transferred from the heating fluid, through the delivery tubing, through the microclimate article, and into the microclimate. For example, a wearable jacket has been made to include small diameter, flexible tubing that is routed between layers of cloth of the jacket. Heating fluid flowing through the tubing in the jacket heats the wearer of the jacket.

After the heat is transferred out of the fluid, return tubing 118*b* carries the cooled fluid back to a portable heater 82, which re-heats the fluid. Portable heater 82 comprises a heat source 84 and heat exchanger 16. Preferably, portable heater 82 is small enough and light enough to be easily carried, such as on a user's belt. As a result, heat source 84 and heat exchanger 16 are also preferably very compact. Heat source 84 and heat exchanger 16 may even be combined into a single element, such as a burning carbon stick or a chemically reactive warming pack. Heat exchanger 16 is also preferably very efficient, such as approximately 90% efficient. Heat exchanger 16 may include a heating channel through which the fluid flows and is heated. Alternatively, heat exchanger 16 may be located adjacent to a heating chamber through which the fluid flows and is heated. The fluid may be water, steam, air, glycol's, or other fluid that has beneficial heat transfer characteristics, and is preferably noncombustable. The fluid is also preferably a liquid.

The fluid may circulate through the tubing as a result of a pressure and density differential between the heated fluid and the cooled fluid. To ensure the fluid continues to flow in the desired direction, a one-way valve 115 may be inserted in series with the tubing to prevent back flow. Optionally, a pumping unit 90 may be utilized to improve circulation of the fluid. As with heater 82, preferably, pumping unit 90 is also very compact and light for easy carrying. Pumping unit 90 comprises a pump 92, a prime mover 93, and, optionally, a power source 94. Prime mover 93 is preferably an electric motor. Power source 94 may be a conventional non-rechargeable battery or a rechargeable battery.

If a rechargeable battery is utilized, an optional thermoelectric module 96 may utilize heat from heater 82 or heat from the fluid to generate an electric current that can recharge the battery. Alternatively, thermoelectric module 96 may provide power directly to prime mover 93, acting as power source 94. In addition, or alternatively, thermoelectric module 96 may provide power to a power outlet 97, which may be utilized to power a GPS device, a cellular phone, a consumer electronic device, or other device requiring electric power. Thermoelectric module 96 may utilize heater 82 to provide heat to a hot side and utilize the heating fluid as a heat sink for a cold side. Although the fluid is heated, the fluid is cooler than heat provided from heater 82. Therefore, the necessary heat differential is present for thermoelectric module 96 to generate electricity. Alternatively, thermoelectric module 96 may utilize the heating fluid to provide heat to the hot side and utilize housing 102 as a heat sink for the cold side. Those skilled in the art will recognize that other configurations may be employed to provide the necessary heat differential.

An optional controller 98 may also be utilized to regulate the amount of heat provided to microclimate article 80. Controller 98 may control heater 82 and/or pumping unit 90. Controller 98 may optionally utilize a sensor 99 to monitor heat from heater 82, monitor flow through pumping unit 90, detect excessive heat, detect fuel levels, ensure that fuel is shut off, detect and react to any other malfunction, or provide other monitoring functions. Controller 98, sensor 99, heater 82, and pumping unit 90 are preferably incorporated into a single microclimate heating unit (MCHU) 100.

Figure 7:
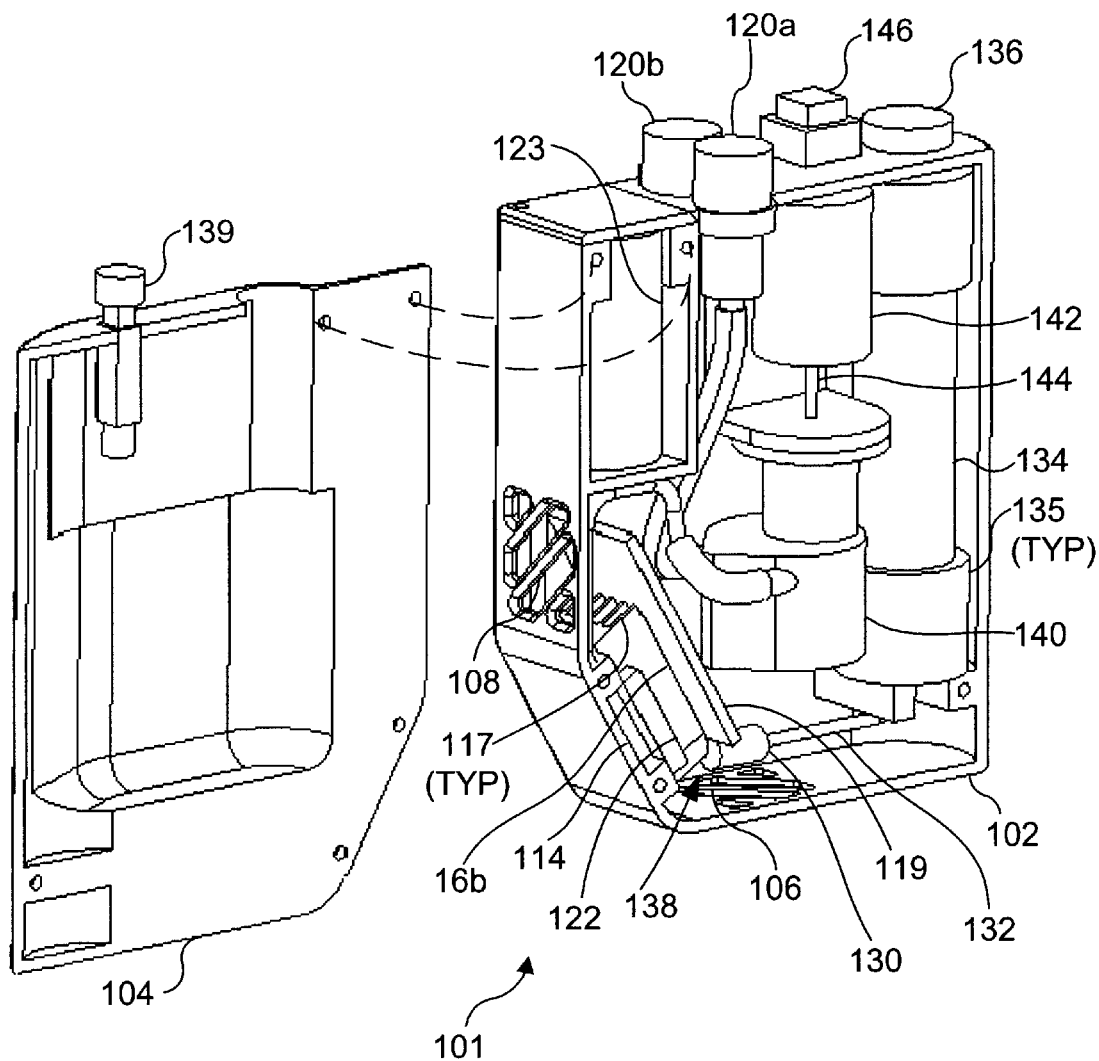
FIG. 7 is an isometric view of a preferred embodiment of a microclimate heating unit that utilizes a combustion heat source.

FIG. 7 is an isometric view of a preferred embodiment of a microclimate heating unit that utilizes a combustion heat source. Combustion MCHU 101 comprises a housing 102 and a cover 104 that is fastened to housing 102 with fasteners (not shown) to enclose other components discussed below. Combustion MCHU 101 is approximately 14 cm tall, by 12 cm wide, by 4 cm deep, and weighs approximately 0.55 kg or less. Preferably, housing 102 and a cover 104 are made of a heat-tolerant material that will not deteriorate as a result of combustion occurring within housing 102. Housing 102 also comprises an air inlet 106 for providing air to the combustion, and an exhaust outlet 108 that enables exhaust gases to escape from housing 102. A flash-arresting screen (not shown) may cover air inlet 104 and exhaust outlet 108 to protect against particles passing through. Housing 102 also preferably is formed with a clip (not shown) or a slot (not shown) that enables a user to attach combustion MCHU 101 to the user's belt or other mount.

Combustion occurs via a burner 130 within housing 102, which is preferably located near air inlet 106. Burner 130 preferably burns the same type of fuel as a camping stove, such as butane. Burner 130 receives fuel through a rigid fuel line 132 that holds burner 130 away from directly contacting housing 102, a cover 104, or any other component within housing 102. Fuel line 132 is connected between burner 130 and a fuel canister 134. Preferably, fuel canister 134 is a replaceable canister with a volume sufficient to provide 2 hours of continuous fuel flow, such as those used for compact, single-burner camping stoves. Fuel canister 134 may be secured within housing 102 via one or more canister mounts 135 that are attached to, or formed as part of housing 102. A fuel control 136 is connected to fuel canister 134, and protrudes through housing 102. Fuel control 136 enables a user to control the flow of fuel to burner 130. Controlling the flow of fuel, enables a user to control the amount of heat transferred to the fluid, and, therefore, the amount of heat provided to the user's microclimate via the microclimate article. The fuel may be ignited with a starter 139, such as a piezo-electric starter. Starter 139 protrudes through cover 104, and extends an ignition wire (not shown) to a combustion chamber 138 comprising an area within housing 102, near burner 130.

Burner 130 burns the fuel and inlet air in close proximity to a heat exchanger 16*b*. Preferably, burner 130 produces approximately 80 watts of heat energy. As with heat exchanger 16 described above with regard to the modular water heaters, heat exchanger 16*b* is preferably a highly efficient heat exchanger, such as a MESO-SCALE™ heat exchanger from MESOSYSTEMS TECHNOLOGY™, Inc. In the case of a jacket microclimate article, heat exchanger 16b preferably heats the fluid by approximately 20 degrees Celsius, enabling combustion MCHU 101 to provide approximately 70 watts of heating to a wearer's body. Preferably, the heated inlet air resulting from the combustion flows longitudinally along fins 117 of heat exchanger 16b, and exhausts through exhaust outlet 108. A heat shield 119 is also provided in close proximity to the open end of fins 117 to help direct the flow of heated inlet air along fins 117, and to protect other components within housing 102 from the heat, exhaust gases, and unburned fuel. Preferably, heat shield 119 is formed as part of housing 102. The flame from burner 130 may also directly contact heat exchanger 16b.

Cool fluid flows into heat exchanger 16b through a fluid inlet 120a that protrudes through housing 102. The cool fluid passes through a one-way valve (not shown) and into a heating chamber 114. Heating chamber 114 is located adjacent to heat exchanger 16b, and is preferably incorporated into housing 102. Heat exchanger 16b transfers heat to the fluid in heating chamber 114, and the heated fluid flows out to the microclimate article through a fluid outlet 120b that also protrudes through housing 102.

Although the fluid will flow as a result of the pressure differential between the heated fluid and the cool fluid, preferably, the cool fluid is pumped through heat exchanger 16b with a pump 140. Pump 140 is preferably in fluid connection between fluid inlet 120a and heat exchanger 16b, and is secured to housing 102. In the case of the jacket microclimate article; pump 140 is sized to pump approximately 0.75 liters of the fluid at approximately 50 ml/min. through approximately 12 meters of 0.125 inch outer diameter silicone tubing incorporated into the jacket. However, those skilled in the art will recognize that the size of pump 140 will depend on the rate and volume of flow desired. An impeller (not shown) of pump 140 is rotatably driven by a drive shaft 144 of an electric motor 142, which is secured to housing 102. A power switch 146 is electrically connected to motor 142, and protrudes through housing 102, enabling a user to switch power on and off to motor 142.

A battery 123 may be electrically connected through switch 146 to power motor 142. Battery 123 may be a replaceable battery or a rechargeable battery, such as a 1.5 volt C cell. Battery 123 is secured within housing 102. Preferably, however, a thermoelectric module 122, such as the peltier thermoelectric module described above, is also provided within housing 102. Thermoelectric module 122 is located between heat exchanger 16b and heating chamber 114. Thermoelectric module 122 may be incorporated into a body of heat exchanger 16b such that a cold side (not shown) of thermoelectric module 122 remains exposed to heating chamber 114. Preferably, thermoelectric module 122 has width and length dimensions comparable to those of heat exchanger 16b. Those skilled in the art will recognize that thermoelectric module 122 could be located between heating chamber 114 and an outer surface of housing 102, or in another location that would provide a temperature differential. Thermoelectric module 122 may be electrically connected to a rechargeable battery 123, or to motor 142, or both. Preferably, thermoelectric module 122 generates enough electricity to drive motor 142 independently. For example, when heat exchanger 16b is utilized for the hot side and the heated fluid in heating chamber 114 is utilized for the cold side, thermoelectric module 122 produces approximately 2 watts of power. In that case, battery 123 may be removed to reduce the weight and size of combustion MCHU 101.

Although the present invention has been described in connection with the preferred form of practicing it and modifications thereto, those of ordinary skill in the art will understand that many additional modifications can be made to the present invention within the scope of the claims that follow. For example, it is contemplated that various optional components discussed above may be separate modules that can be carried separately and connected as desired. Such optional modules may also be carried on a belt, a backpack, a microclimate article, or other carrier. Accordingly, it is not intended that the scope of the invention in any way be limited by the above description, but instead be determined entirely by reference to the claims that follow.

The invention in which an exclusive right is claimed is defined by the following:

1. Portable water heating apparatus adapted to be used with a source of heat, said apparatus comprising:
   (a) a water reservoir having an opening at one end;
   (b) a cap having a size and a configuration adapted to seal the opening in the end of the water reservoir, enabling the water reservoir to be inverted with the one end sealed by the cap facing downwardly, said cap including a fluid inlet and a fluid outlet;
   (c) a fluid heating channel comprising a first end and a second end, said first end being in fluid communication with said fluid outlet, and said second end being in fluid communication with said fluid inlet, so that cool water from said water reservoir flows into the fluid heating channel to be heated; and
   (d) a heat exchanger adapted to be disposed above a source of heat and to absorb thermal energy from the source of heat, said heat exchanger being disposed adjacent to said fluid heating channel and between the source of heat and the fluid heating channel so that the thermal energy is transferred from said heat exchanger to said fluid heating channel to heat the water within said fluid heating channel, at least a portion of the water in the fluid heating channel being returned to said water reservoir via a convective flow.

2. The apparatus of claim 1, wherein said cap is adapted to engage said one end of said water reservoir with a seal that remains intact up to a predetermined pressure, at which point the seal fails, thereby releasing an excess pressure above the predetermined pressure, thereby avoiding damage to the apparatus.

3. The apparatus of claim 2, wherein said predetermined pressure comprises at least approximately 10 psi.

4. The apparatus of claim 1, wherein said heat exchanger comprises a plurality of radially or spirally oriented fins that contact the fluid heating channel.

5. The apparatus of claim 1, wherein said fluid outlet comprises a one-way valve adapted to enable water to flow from the water reservoir through the fluid outlet, but to prevent water heated within said fluid heating channel from entering the water reservoir through said fluid outlet.

6. The apparatus of claim 5, wherein said one-way valve cycles between an open state and a closed state in response to changing temperature and pressure conditions within said water reservoir and said fluid heating channel, such that as water disposed within said fluid heating channel is heated and exits said fluid heating channel, said ball valve cycles to its open state, and water flows from the water reservoir and into the fluid heating channel to replace fluid that has exited the fluid heating channel.

7. The apparatus of claim 1, wherein said heat exchanger comprises a low density and thermally conductive metal.

8. The apparatus of claim 1, wherein said heat exchanger is removably attached to said cap.

9. The apparatus of claim 1, further comprising a hot water outlet adapted to be in fluid communication with the water reservoir, through which hot water can be selectively removed.

10. The apparatus of claim 9, wherein said hot water outlet comprises a pressure relief valve designed to open at a predetermined pressure, said predetermined pressure corresponding to a desired temperature of water that is thereby automatically discharged through said hot wafer outlet.

11. The apparatus of claim 1, wherein said heat exchanger comprises a flat base adapted to support said apparatus.

12. The apparatus of claim 1, wherein said cap further comprises a hot water outlet adapted to be in fluid communication with said water reservoir, through which hot water and steam can be removed.

13. The apparatus of claim 12, further comprising a fluid channel having a first end and a second end, said first end being in fluid communication with said hot water outlet, and said second end being adapted to extend inside the water reservoir, to a point adjacent to a closed end thereof, such that steam accumulating within the water reservoir is removed from the water reservoir through said hot water outlet via the fluid channel.

14. The apparatus of claim 13, further comprising a condenser coupled in fluid communication with said hot water outlet, said condenser condensing steam generated by said apparatus into potable liquid water.

15. The apparatus of claim 14, wherein said condenser comprises a coiled metal tube.

16. The apparatus of claim 1, wherein the water reservoir is fabricated from a plastic material.

17. The apparatus of claim 16, wherein said water reservoir is substantially transparent or translucent to visible light, such that an operator can observe a level of water contained within said water reservoir, the operator being thus enabled to visually determine when the water contained within said water reservoir is boiling.

18. The apparatus of claim 1, further comprising a fluid channel having a first end and a second end, said first end being in fluid communication with said fluid inlet, and said second end being adapted to be in fluid communication with an interior upper portion of the water reservoir, such that heated water entering the water reservoir from said fluid heating channel is directed into the upper portion of the water reservoir.

19. The apparatus of claim 1, further comprising a temperature-sensing element that is adapted to indicate a temperature of water within said water reservoir.

20. The apparatus of claim 19, wherein said temperature-sensing element comprises a liquid crystal thermometer or temperature sensitive material.

21. The apparatus of claim 1, further comprising a thermoelectric module that generates an electric current when exposed to a temperature differential, said thermoelectric module comprising a first surface adapted to be disposed adjacent to said water reservoir, such that thermal energy is exchanged between said first surface and water provided by said water reservoir; and a second surface disposed adjacent to said heat exchanger and adapted to be heated by a heat source, said thermoelectric module including contacts for coupling to an electrical device.

22. The apparatus of claim 21, wherein said contacts comprise leads adapted to connect to a rechargeable battery, said thermoelectric module being thus adapted to provide an electric current for recharging a rechargeable battery.

23. The apparatus of claim 21, further comprising a cool water reservoir in fluid communication with said fluid outlet and with said first end of said fluid heating channel, said cool water reservoir being disposed adjacent to said first surface of said thermoelectric module such that a heat transfer relationship is established, so that when said apparatus is operating, cool water from the water reservoir fills said cool water reservoir, thereby cooling the first surface of said thermoelectric module to develop the temperature differential.

24. The apparatus of claim 23, wherein said heat exchanger is removably attached to said apparatus, and said thermoelectric module is disposed between said cool water reservoir and said heat exchanger, and is secured to said apparatus by a compressive force.

25. The apparatus of claim 24, wherein at least one of said first and said second surfaces of said thermoelectric module is coated with a thermally conductive substance.

26. The apparatus of claim 25, wherein said thermoelectric module comprises a semiconductor material.

27. A water heater apparatus adapted to be used with a source of heat, comprising:
(a) a water reservoir having a closed end and an open end, said water reservoir being removable and usable for storing water;
(b) a cap of a size and shape corresponding to said open end and configured to sealingly engage said open end with the water reservoir inverted so that the closed end is directed upwardly, said cap comprising a fluid inlet and a fluid outlet; water contained within said water reservoir flowing from said water reservoir through said fluid outlet, and water entering said water reservoir through said fluid inlet;
(c) a fluid heating channel having a first end and a second end, said first end being coupled in fluid communication with said fluid outlet, and said second end being coupled in fluid communication with said fluid inlet; and
(d) a heat exchanger adapted to absorb thermal energy from a heat source, said heat exchanger being disposed between the heat source and the cap, in contact with said fluid heating channel, such that thermal energy is exchanged between said fluid heating channel and said heat exchanger, so that relatively cool water entering said fluid heating channel from said fluid outlet is substantially heated and is discharged from said fluid heating channel into said water reservoir through said fluid inlet, thereby increasing a temperature of water contained within said water reservoir.

28. A modular water heater apparatus adapted to be used with a source of heat, comprising:
(a) a water reservoir module that is portable and is usable for storing and carrying water;
(b) a thermoelectric module capable of generating an electric current in response to being exposed to a temperature differential, said thermoelectric module comprising a first surface disposed adjacent to said water reservoir such that said first surface is cooled by water within said water reservoir; and a second surface disposed opposite to said first surface and adapted to receive heat produced by a heat source;
(c) a heat exchanger module disposed adjacent to a second surface of said thermoelectric module, said second surface being disposed such that thermal energy is exchanged between said second surface and said heat exchanger to increase a temperature of the second surface above that of the first surface in order to create the temperature differential required by the thermoelectric module for generating the electrical current, said heat exchanger being adapted to absorb thermal energy from a source of heat; and (d) a fluid heating channel disposed adjacent to and in thermal contact with said heat exchanger, such that thermal energy is transferred to said fluid heating channel from said heat exchanger, said fluid heating channel being coupled in fluid communication with said water reservoir, enabling relatively cool water from said water reservoir to enter said fluid heating channel, and relatively hot water and/or steam from said fluid heating channel to enter said water reservoir.

29. A method for heating water in a water storage reservoir using a source of heat, comprising the steps of:

(a) providing:
  (i) a water storage reservoir that includes an opening; and
  (ii) a water heater apparatus that includes a heat exchanger adapted to absorb thermal energy from a source of heat, a cap that is configured to sealingly connect to the opening of the water storage reservoir, and a fluid heating channel thermally coupled to said heat exchanger;

(b) connecting the water storage reservoir to the heat exchanger and fluid heating channel so that a first end of said fluid heating channel is coupled in fluid communication with said water reservoir to receive cool water from a lower portion of the water storage reservoir, and a second end of said fluid heating channel is in fluid communication with the water storage reservoir to deliver hot water to an upper portion of the water storage reservoir;

(c) inverting the water storage reservoir connected to the heat exchanger and fluid heating channel, so that the opening is facing downwardly and the water storage reservoir is disposed above the heat exchanger; and (d) placing said heat exchanger adjacent to a heat source, such that said heat exchanger absorbs thermal energy that is transferred to said fluid heating channel to heat water contained within the fluid heating channel, producing hot water and/or steam that is delivered into the upper portion of the water storage reservoir so that the water contained therein is heated to a desired temperature.

30. The method of claim 29, further comprising the step of enabling water to flow through the fluid heating channel from the lower portion of the water storage reservoir through an inlet formed in the cap and back into the upper portion of the water storage reservoir through an outlet tube coupled to the cap that extends into the upper portion of the water storage reservoir.

31. The method of claim 28, further comprising the step of providing a thermoelectric module disposed between said water reservoir and said heat exchanger, to generate an electrical current in response to a temperature differential developed across the thermoelectric module.

32. The method of claim 31, further comprising the step of enabling a user to electrically couple the thermoelectric module to an electrically powered device so that the electrical current produced by the thermoelectric module energizes the electrically powered device.

33. The method of claim 31, further comprising the step of enabling a user to electrically couple the thermoelectric module to a rechargeable battery so that the electrical current produced by the thermoelectric module charges said rechargeable battery.

34. The method of claim 28, further comprising the step of enabling a user to withdraw hot water from the water storage reservoir without disconnecting the water storage reservoir from the heat exchanger and fluid heating channel.

35. The method of claim 28, wherein the step of providing further comprises the step of providing a condenser adapted to couple in fluid communication with the water storage reservoir and to condense steam received therefrom to liquid water.

36. A method for generating an electrical current using water heater apparatus and a source of heat, comprising the steps of:

(a) providing water heater apparatus that includes:
  (i) a cool water reservoir adapted to couple in fluid communication with a portable water reservoir, said cool water reservoir being substantially smaller than said portable water reservoir;
  (ii) a heat exchanger adapted to absorb thermal energy from a source of heat;
  (iii) a fluid heating channel adapted to couple in fluid communication with the portable water reservoir, and disposed adjacent to and in thermal contact with said heat exchanger to heat water disposed in said fluid heating channel; and
  (iv) a thermoelectric module that generates an electrical current when exposed to a temperature differential, said thermoelectric module being disposed between the cool water reservoir and the heat exchanger;

(b) coupling one end of said fluid heating channel and said cool water reservoir in fluid communication with a lower portion of the portable water reservoir, to receive cool water therefrom, and coupling an opposite end of said fluid heating channel to an upper portion of the portable water reservoir, to supply heated water thereto;

(c) exposing said heat exchanger to a heat source, such that said heat exchanger absorbs thermal energy, which is transferred to the thermoelectric module and to the fluid heating channel to heat water in the upper portion of the portable water reservoir; and (d) enabling a user to electrically couple the thermoelectric module to an electrical device so that the thermoelectric module supplies an electrical current to the electrical device while water is being heated and supplied to the upper portion of the portable water reservoir.

37. The method of claim 36, further comprising the step of enabling a user to selectively withdraw heated water from the portable water storage reservoir without de-coupling the fluid heating channel from the portable water reservoir.

38. A method for purifying water in a portable water reservoir, comprising the steps of:

(a) providing water heater apparatus that includes:
  (i) a heat exchanger adapted to absorb thermal energy from a source of heat;
  (ii) a fluid heating channel adapted to couple in fluid communication with a lower portion of a water reservoir to receive water therefrom, and to couple in fluid communication with an upper portion of a water reservoir to deliver steam thereto, said fluid heating channel being disposed adjacent to and in thermal contact with said heat exchanger, so that heat is transferred to said fluid heating channel from the heat exchanger when the heat exchanger is heated by a source of heat; and
  (iii) a condenser adapted to couple to the portable water reservoir for use in condensing steam received from the portable water reservoir to produce liquid water when a surface of the condenser is exposed to a temperature substantially cooler than the steam;

(b) coupling a first end of said fluid heating channel in fluid communication with the lower portion of said portable water reservoir to receive the water from the lower portion, and coupling a second end of said fluid heating channel in fluid communication with the upper portion of said portable water reservoir to supply steam produced by applying heat transferred from the heat exchanger to the fluid heating channel;

(c) filling said fluid heating channel with relatively cool water from the lower portion of the portable water reservoir;

(d) enabling a user to position said heat exchanger adjacent to a heat source, such that said heat exchanger absorbs thermal energy from the heat source, and so that heat transferred from the heat exchanger to the fluid heating channel boils a mass of water disposed therein, producing steam that is supplied to the upper portion of the portable water reservoir; and (e) enabling steam disposed in the upper portion of the portable water reservoir to flow into said condenser, where it is condensed into potable liquid water.

39. A method for generating an electric current while purifying water, comprising the steps of:

(a) providing water heater apparatus that includes:
(i) a heat exchanger adapted to absorb thermal energy from a source of heat;
(ii) a fluid heating channel adapted to couple in fluid communication with a lower portion of a water reservoir to receive water therefrom, and to couple in fluid communication with an upper portion of a water reservoir to deliver steam thereto, said fluid heating channel being disposed adjacent to and in thermal contact with said heat exchanger, so that heat is transferred to said fluid heating channel from the heat exchanger when the heat exchanger is heated by a source of heat;
(iii) a condenser adapted to couple to the portable water reservoir for use in condensing steam received from the portable water reservoir to produce liquid water when a surface of the condenser is exposed to a temperature substantially cooler than the steam; and
(iv) a thermoelectric module that generates an electrical current when exposed to a temperature differential, said thermoelectric module being disposed between the heat exchanger and the portable water reservoir;

(b) coupling a first end of said fluid heating channel in fluid communication with the lower portion of said portable water reservoir to receive the water from the lower portion, and coupling a second end of said fluid heating channel in fluid communication with the upper portion of said portable water reservoir to supply steam produced by applying heat transferred from the heat exchanger to the fluid heating channel;

(c) filling said fluid heating channel with relatively cool water from the lower portion of the portable water reservoir;

(d) enabling a user to position said heat exchanger adjacent to a heat source, such that said heat exchanger absorbs thermal energy from the heat source and so that heat transferred from the heat exchanger to the fluid heating channel boils a mass of water disposed therein, producing steam that is supplied to the upper portion of the portable water reservoir;

(e) enabling steam disposed in the upper portion of the portable water reservoir to flow into said condenser, where it is condensed into potable liquid water that is purified; and (f) heating one side of said thermoelectric module with heat transferred from the heat exchanger, while cooling an opposite side with water from the portable water reservoir, thereby producing the differential temperature that causes the thermoelectric module to generate an electric current while the potable liquid water being produced.

40. The method of claim 39, further comprising the step of enabling a user to electrically connect an electrical device to the thermoelectric module, said electrical device being energized by the electric current.

41. A portable apparatus for heating a microclimate that defines a region in which a temperature is to be modified, comprising:

(a) a portable microclimate heating article (PMCHA) that defines the boundaries of the microclimate, said PMCHA comprising:
(i) a base element that defines a structural configuration of the PMCHA; and
(ii) a delivery channel in the base element that carries a heating fluid used to transfer heat energy between the base element and the microclimate; and (b) a portable heating unit in fluid connection with the PMCHA, said portable heating unit comprising:
(i) a heat source;
(ii) a heat exchanger disposed proximate to the heat source; and
(iii) a heating chamber in fluid communication with the delivery channel and in proximity to the heat exchanger, said heat source heating the heat exchanger, transferring heat energy to the heating fluid flowing through the heating chamber and through the delivery channel, said heating fluid returning to the heating chamber after flowing through the delivery channel of the PMCHA and modifying the temperature of the microclimate.

42. The portable apparatus of claim 41, the PMCHA comprises one of a wearable jacket, a vest, a body garment, a sleeping bag, a sleeping mat, a blanket, a tent, and a container.

43. The portable apparatus of claim 41, wherein the delivery channel comprises a flexible tubing.

44. The portable apparatus of claim 41, wherein the heating fluid comprises one of water, steam, air, and a glycol.

45. The portable apparatus of claim 41, wherein the heat source produces heat by one of combustion and chemical reaction.

46. The portable apparatus of claim 41, wherein the heat source comprises one of a fuel burner, a burning carbon stick, and a chemically reactive warming pack.

47. The portable apparatus of claim 41, further comprising a fuel storage that provides a fuel to the heat source.

48. The portable apparatus of claim 41, wherein the heat exchanger comprises a heating channel in fluid connection with the heating chamber, said heat exchanger heating the heating fluid in the heating channel.

49. The portable apparatus of claim 41, wherein the heat exchanger is integral with the heating chamber.

50. The portable apparatus of claim 41, wherein the heat exchanger comprises a meso-scale heat exchanger.

51. The portable apparatus of claim 41, further comprising a pump in fluid communication with the delivery channel and with the heating chamber, said pump causing the heating to circulate through the heating chamber and the delivery channel.

52. The portable apparatus of claim 49, further comprising a prime mover drivingly coupled to the pump.

53. The portable apparatus of claim 50, wherein the prime mover comprises an electric motor.

54. The portable apparatus of claim 41, further comprising a one-way valve in fluid communication with the delivery channel to ensure that the heating fluid flows in a preferred direction.

55. The portable apparatus of claim 41, further comprising a thermoelectric module that generates an electric current when exposed to a temperature differential, said thermoelectric module comprising a first surface disposed adjacent to the heating chamber, such that thermal energy is exchanged between said first surface and the heating fluid in the heating chamber; and a second surface disposed adjacent to the heat exchanger so as to be heated by the heat source raid thermoelectric module including contacts for coupling to an electrical device.

56. The portable apparatus of claim 55, wherein the thermoelectric module is coupled to one of a rechargeable battery, a motor, a power outlet, and a consumer electronic device.

57. The portable apparatus of claim 56, wherein the motor drives a pump in fluid communication with the delivery channel, said pump pumping the heating fluid.

58. The portable apparatus of claim 41, further comprising a controller coupled to the PMCHA and to the portable heating unit, said controller controlling the heat energy transferred to the microclimate.

59. The portable apparatus of claim 41, further comprising a sensor in communication with one of the PMCHA and the portable heating unit, said sensor monitoring a performance criterion of the portable apparatus.

60. The portable apparatus of claim 41, wherein the portable heating unit further comprises a housing enclosing the heat source, the heat exchanger, and the heating chamber.

61. The portable apparatus of claim 60, wherein the housing is adapted to be one of carried on a belt and hand-held.

62. A method for heating a microclimate that defines a region in which a temperature is to be modified, comprising the steps of:

(a) incorporating a delivery channel into a portable microclimate heating article (PMCHA) that defines the boundaries of the microclimate;

(b) thermally coupling the delivery channel to a portable microclimate heating unit;

(c) heating a heating fluid with the portable microclimate heating unit; and (d) circulating the heating fluid through the delivery channel of the PMCHA, thereby causing thermal energy to transfer from the heating fluid to the PMCHA defining the microclimate.

63. The method of claim 62, where in the PMCHA comprises one of a wearable jacket, a vest, a body garment, a sleeping bag, a sleeping mat, a blanket, a tent, and a container.

64. The method of claim 62, where in the step of incorporating the delivery channel into the PMCHA comprises one of the steps of:

(a) routing tubing through the PMCHA; and (b) forming the delivery channel in the PMCHA.

65. The method of claim 62, wherein the step of thermally coupling the delivery channel to a portable microclimate heating unit comprises the step of transferring thermal energy to the heating fluid in the delivery channel through a heat exchanger.

66. The method of claim 65, wherein the heat exchanger is a meso-scale heat exchanger.

67. The method of claim 62, wherein the step of heating the heating fluid comprises the steps of activating a heat source that is thermally coupled to the heating fluid in the delivery channel.

68. The method of claim 67, wherein the heat source produces heat by one of a fuel combustion and a non-combustion chemical reaction.

69. The method of claim 67, wherein the heat source transfers thermal energy to a heat exchanger that is thermally coupled to the heating fluid in the delivery channel.

70. The method of claim 62, wherein the step of circulating the heating fluid through the delivery channel of the PMCHA comprises the step of pumping the heating fluid through the delivery channel.

71. The method of claim 62, further comprising the step of generating electrical energy from a temperature differential between the heating fluid and a heat source of the portable microclimate heating unit.

* * * * *

UNITED STATES PATENT AND TRADEMARK OFFICE
CERTIFICATE OF CORRECTION

PATENT NO. : 6,694,739 B2
DATED : February 24, 2004
INVENTOR(S) : Robert Beckius et al.

It is certified that error appears in the above-identified patent and that said Letters Patent is hereby corrected as shown below:

Column 14,
Line 41, "bums" should read -- burns --

Column 15,
Line 29, "article;" should read -- article, --

Column 16,
Line 30, "thennal" should read -- thermal --

Column 17,
Line 9, "wafer" should read -- water --

Column 19,
Line 53, "Claim 28" should read -- Claim 29 --

Column 20,
Lines 1 and 5, "Claim 28" should read -- Claim 29 --

Column 22,
Line 41, after "Claim 41" insert -- wherein --

Column 23,
Line 2, after "heating" insert -- fluid --
Lines 19-20, "source raid" should read -- source, said --

Signed and Sealed this

Twenty-first Day of September, 2004

JON W. DUDAS
*Director of the United States Patent and Trademark Office*